(12) United States Patent
Choi et al.

(10) Patent No.: US 7,812,529 B2
(45) Date of Patent: Oct. 12, 2010

(54) WHITE ORGANIC LIGHT EMITTING DEVICE

(75) Inventors: Jun-Ho Choi, Yongin-si (KR); Jae-Kook Ha, Yongin-si (KR); Seong-Min Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 161 days.

(21) Appl. No.: 12/038,595

(22) Filed: Feb. 27, 2008

(65) Prior Publication Data

US 2008/0224602 A1 Sep. 18, 2008

(30) Foreign Application Priority Data

Mar. 12, 2007 (KR) .................. 10-2007-0024027

(51) Int. Cl.
*H01J 1/62* (2006.01)
*H01J 63/04* (2006.01)
(52) U.S. Cl. .................. 313/506; 313/498; 313/503; 313/504
(58) Field of Classification Search .......... 313/498–512
See application file for complete search history.

(56) References Cited

U.S. PATENT DOCUMENTS

| | | | | |
|---|---|---|---|---|
| 2003/0170491 | A1* | 9/2003 | Liao et al. | 428/690 |
| 2006/0040132 | A1* | 2/2006 | Liao et al. | 428/690 |
| 2006/0188745 | A1* | 8/2006 | Liao et al. | 428/690 |
| 2006/0240278 | A1* | 10/2006 | Hatwar et al. | 428/690 |
| 2007/0046189 | A1* | 3/2007 | Hatwar et al. | 313/506 |
| 2008/0252202 | A1* | 10/2008 | Li et al. | 313/504 |
| 2008/0315753 | A1* | 12/2008 | Liao et al. | 313/504 |
| 2009/0001882 | A1* | 1/2009 | Park et al. | 313/504 |
| 2009/0001885 | A1* | 1/2009 | Spindler et al. | 313/506 |
| 2009/0051273 | A1* | 2/2009 | Tsuji et al. | 313/504 |

FOREIGN PATENT DOCUMENTS

| | | |
|---|---|---|
| JP | 2006-066379 | 9/2006 |
| KR | 1020030015611 | 2/2003 |
| KR | 1020030069097 | 8/2003 |
| KR | 1020050039674 | 4/2005 |

* cited by examiner

*Primary Examiner*—Toan Ton
*Assistant Examiner*—Kevin Quarterman
(74) *Attorney, Agent, or Firm*—Innovation Counsel LLP

(57) ABSTRACT

A white organic light emitting device includes: an anode formed on a substrate; a first emissive layer, in which a first sub-emissive layer and a second sub-emissive layer are stacked, formed on the substrate; a second emissive layer, in which a third sub-emissive layer and a fourth sub-emissive layer are stacked, formed on the first emissive layer; a first intermediate layer supplying electrons to the first emissive layer and a second intermediate layer supplying holes to the second emissive layer, wherein the first and second intermediate layers are formed between the first emissive layer and the second emissive layer; and a cathode formed on the second emissive layer.

15 Claims, 5 Drawing Sheets 153 175 154

WHITE ORGANIC LIGHT EMITTING DEVICE

CROSS-REFERENCE TO RELATED APPLICATION

This application claims priority to and the benefit of Korean Patent Application No. 10-2007-0024027, filed on Mar. 12, 2007, the disclosure of which is incorporated herein by reference in its entirety.

BACKGROUND OF THE INVENTION

1. Field of the Invention

The present invention relates to a white organic light emitting device and, more particularly, to a white organic light emitting device which includes first and second emissive layers each having a blue emissive layer to improve the light emission efficiency.

2. Description of the Related Art

Image display devices that are thinner, lighter and more portable and that employ organic light emitting displays (OLED), have attracted much attention. The OLED has the advantage that it can be manufactured paper-thin, with a light emitting element using a thin emissive layer between electrodes.

The OLED includes an anode transmitting light, a cathode reflecting light, and an emissive layer having a plurality of organic layers stacked between the anode and the cathode. When a voltage is applied between the cathode and the anode, light generated from the organic emissive layer is emitted through the anode, or transferred to the cathode opposite to the anode and reflected back to the anode and then emitted through the anode.

The organic emissive layer in a white organic light emitting device has a basic structure in which red (R), green (G) and blue (B) emissive layers are stacked. When the stacked R, G and B emissive layers emit light simultaneously, it is possible to obtain well-balanced white light emission. However, it is difficult to manufacture a white organic light emitting device having high efficiency and R, G and B properly balanced.

One approach to solving the problem of efficiency in the stacked structure involves the use of an intermediate, charge-injecting layer inserted between emissive layers so as to increase the quantum efficiency and light emission efficiency. However, the fabrication process is complicated.

SUMMARY OF THE INVENTION

The present invention provides a white organic light emitting device which includes first and second emissive layers each having a blue emissive layer to improve the light emission efficiency.

In one aspect, the present invention provides a white organic light emitting device including: an anode formed on a substrate; a first emissive layer formed on the substrate, the first emissive layer having a first sub-emissive layer and a second sub-emissive layer stacked thereon; a second emissive layer, in which a third sub-emissive layer and a fourth sub-emissive layer are stacked, formed on the first emissive layer; a first intermediate layer supplying electrons to the first emissive layer and a second intermediate layer supplying holes to the second emissive layer, the first and second intermediate layers being formed between the first emissive layer and the second emissive layer; and a cathode formed on the second emissive layer.

The first sub-emissive layer may be formed of a green (G) emissive layer, the second sub-emissive layer may be formed of a blue (B) emissive layer, the third sub-emissive layer may be formed of a red (R) emissive layer, and the fourth sub-emissive layer may be formed of a blue (B) emissive layer.

The first sub-emissive layer may be formed of a red (R) emissive layer, the second sub-emissive layer may be formed of a blue (B) emissive layer, the third sub-emissive layer may be formed of a green (G) emissive layer, and the fourth sub-emissive layer may be formed of a blue (B) emissive layer.

The first sub-emissive layer may be formed of a blue (B) emissive layer, the second sub-emissive layer may be formed of a green (G) emissive layer, the third sub-emissive layer may be formed of a blue (B) emissive layer, and the fourth sub-emissive layer may be formed of a red (R) emissive layer.

The first sub-emissive layer may be formed of a blue (B) emissive layer, the second sub-emissive layer may be formed of a red (R) emissive layer, the third sub-emissive layer may be formed of a blue (B) emissive layer, and the fourth sub-emissive layer may be formed of a green (G) emissive layer.

A hole injection layer may be further included between the anode and the first emissive layer.

The hole injection layer may be doped with p-type impurities to enhance the hole injection.

A first hole transport layer may be further included between the anode and the hole injection layer, and a second hole transport layer may be further included between the first and second intermediate layers and the second emissive layer.

An electron injection layer may be further included between the second emissive layer and the cathode.

The electron injection layer may be doped with n-type impurities to enhance the electron injection.

A first electron transport layer may be further included between the first emissive layer and the first and second intermediate layers, and a second electron transport layer may be further included between the second emissive layer and the electron injection layer.

The first intermediate layer may be formed of an organic layer doped with n-type impurities and the second intermediate layer may be formed of an organic layer doped with p-type impurities.

The first and second intermediate layers may be formed of a transparent metal material.

A blocking layer may be further included between the first sub-emissive layer and the second sub-emissive layer and between the third sub-emissive layer and the fourth sub-emissive layer, respectively.

BRIEF DESCRIPTION OF THE DRAWINGS

The above and other features of the present invention will be described in reference to certain exemplary embodiments thereof with reference to the attached drawings in which.

DETAILED DESCRIPTION

Reference will now be made in detail to embodiments of the present invention, examples of which are illustrated in the accompanying drawings.

Figure 1:
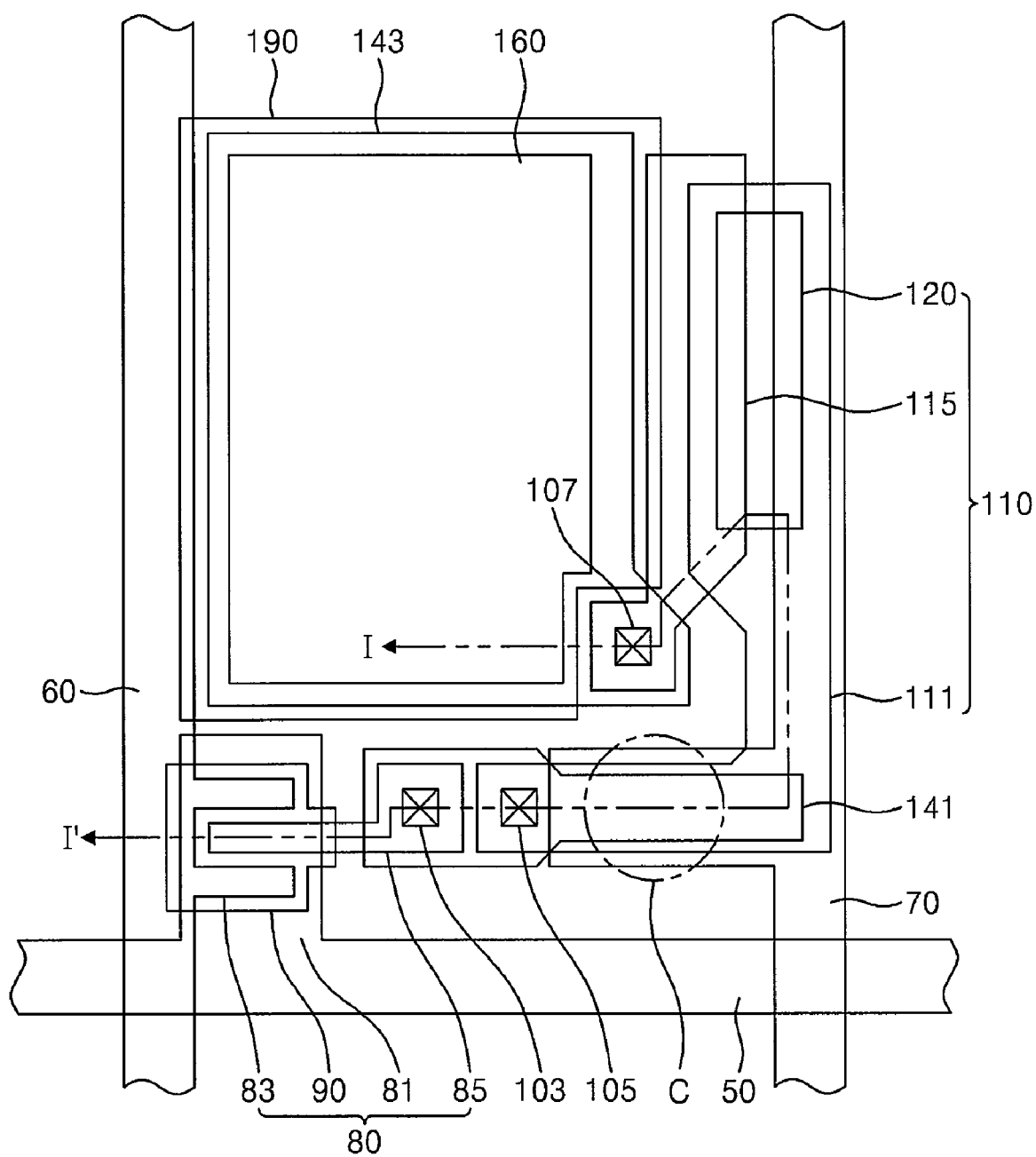
FIG. 1 is a plan view showing a white organic light emitting device in accordance with an exemplary embodiment of the present invention.
Figure 2:
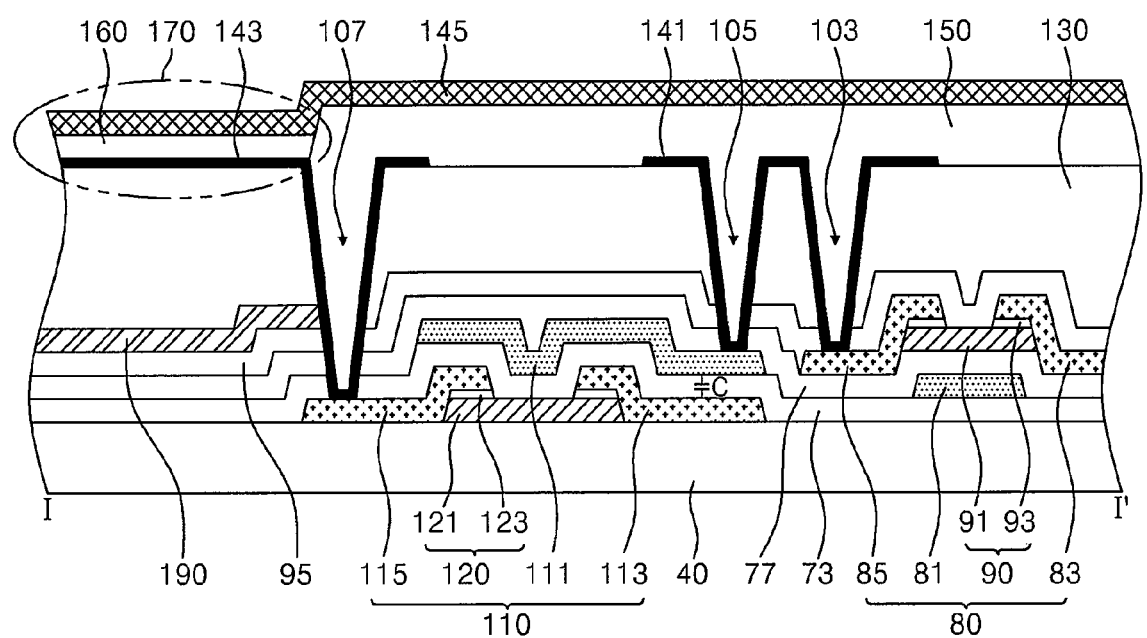
FIG. 2 is a cross-sectional view taken along line I-I' of FIG. 1.

FIG. 1 is a plan view showing a white organic light emitting device in accordance with an exemplary embodiment of the present invention, and FIG. 2 is a cross-sectional view taken along line I-I' of FIG. 1.

Referring to FIGS. 1 and 2, the white organic light emitting device includes a gate line 50, a data line 60, a power line 70, a switching thin film transistor (TFT) 80, a driving TFT 110 and an organic light emitting cell 170.

The gate line 50 supplies a gate signal to the switching TFT 80, the data line 60 supplies a data signal to the switching TFT 80, and the power line 70 supplies a power signal to the driving TFT 110.

When a scan pulse is supplied to the gate line 50, the switching TFT 80 is turned on to supply the data signal applied to the data line 60 to a storage capacitor C and a second gate electrode 111 of the driving TFT 110. Switching TFT 80 includes a first gate electrode 81 connected to the gate line 50, a first source electrode 83 connected to the data line 60, and a first drain electrode 85 facing the first source electrode 83. Electrode 85 is connected to the second gate electrode 111 of the driving TFT 110 and the storage capacitor C through a connection electrode 141. A first semiconductor pattern 90 forms a channel portion between the first source electrode 83 and the first drain electrode 85.

The first semiconductor pattern 90 includes a first active layer 91 overlapping the first gate electrode 81 with a second gate insulating layer 77 disposed therebetween, and a first ohmic contact layer 93, formed on the first active layer 91 other than the channel portion, for an ohmic contact with the first gate electrode 81. The first active layer 91 may be formed of amorphous silicon or polysilicon. Preferably, the first active layer 91 may be formed of amorphous silicon which is advantageous to the on-off operation since the switching TFT 80 requires excellent on-off characteristics.

The driving TFT 110 controls the current applied from the power line 70 to the organic light emitting cell 170 in response to the data signal supplied to the second gate electrode 111, thus controlling the light emitting amount of the organic light emitting cell 170. Driving TFT 110 includes a second gate electrode 111 connected to the first drain electrode 85 of the switching TFT 80 through the connection electrode 141, a second source electrode 113 connected to the power line 70, a second drain electrode 115 facing the second source electrode 113 and connected to an anode 143 of the organic light emitting cell 170. A second semiconductor pattern 120 forms a channel portion between the second source electrode 113 and the second drain electrode 115. The connection electrode 141 connects the first drain electrode 85 of the switching TFT 80 exposed through a first contact hole 103 to the second gate electrode 111 of the driving TFT 110 exposed through a second contact hole 105. The first contact hole 103 penetrates a passivation layer 95 and a planarization layer 130 to expose the first drain electrode 85, and the second contact hole 105 penetrates the second gate insulating layer 77, the passivation layer 95 and the planarization layer 130 to expose the second gate electrode 111.

The semiconductor pattern 120 includes a second active layer 121 overlapping the second gate electrode 111 with a first gate insulating layer 73 disposed therebetween, and a second ohmic contact layer 123, formed on the second active layer 121 other than the channel portion, for an ohmic contact with the second source electrode 113 and the second drain electrode 115. The second active layer 121 may be formed of amorphous silicon or polysilicon. Preferably, the second active layer 121 may be formed of amorphous silicon in terms of the characteristics of the driving TFT 110 in which the current flows continuously during the light emission period of the organic light emitting cell 170.

The power line 70 overlaps the second gate electrode 111 of the driving TFT 110 with the first gate insulating layer 73 disposed therebetween, thus forming the storage capacitor C. The voltage to which the storage capacitor C is charged allows the driving TFT 110 to supply a predetermined current to the organic light emitting cell 170 until a data signal of the next frame arrives so that the organic light emitting cell 170 maintains the light emission, even though the switching TFT 80 is turned off.

The organic light emitting cell 170 includes an anode 143 formed of a transparent conductive material on the planarization layer 130, an organic light emitting layer 160, and a cathode 145.

The anode 143 is formed independently in each sub-pixel area to overlap a color filter 190 on the planarization layer 130. The anode 143 is connected to the second drain electrode 115 of the driving TFT 110 exposed through a third contact hole 107 penetrating the passivation layer 95 and the planarization layer 130, respectively. The anode 143 may be formed of indium tin oxide (ITO), tin oxide (TO), indium zinc oxide (IZO), or indium tin zinc oxide (ITZO).

The cathode 145 faces the anode 143 with the organic light emitting layer 160, formed in the unit of a sub-pixel, disposed therebetween. Accordingly, the emissive layer included in the organic light emitting layer 160 emits light according to the amount of current applied to the cathode 145 to emit white light toward the color filter 190 passing through the cathode 145. The cathode 145 may be formed of a material having excellent electron transport capability and reflection capability such as aluminum (Al), magnesium (Mg), silver (Ag), and calcium (Ca).). A bank insulating layer 150 is disposed between the cathode 145 and the planarization layer 130 such that the bank insulating layer 150 does not overlap the organic light emitting layer 160. More particularly, the bank insulating layer 150 has a hole corresponding to a location of the organic light emitting layer 160 to define the location of the organic light emitting layer 160, thus, the organic light emitting layer 160 is contained in the hole to directly contact with the anode 143.

The organic light emitting layer 160 includes first and second emissive layers stacked on the anode 143, and first and second intermediate layers formed between the first and second emissive layers. The first emissive layer has a structure in which first and second sub-emissive layers are stacked, and the second emissive layer has a structure in which third and fourth sub-emissive layers are stacked. A hole injection layer and a first hole transport layer may be further included between the anode 143 and the first emissive layer 155. Moreover, a second electron transport layer and an electron injection layer may be further included between the second emissive layer and the cathode 145.

The color filter 190 is formed on the passivation layer 95 to overlap the organic light emitting layer 160 generating white light. Accordingly, the color filter 190 displays red (R), green (G) and blue (B) colors using the white light generated from the organic light emitting layer 160. The red (R), green (G) and blue (B) light generated in the color filter 190 are emitted to the outside through an insulating substrate 40.

In the following, the stacked structure of the white organic light emitting cell 170 in accordance with first to fourth exemplary embodiments of the present invention will be described with reference to FIGS. 3 to 6. The stacked structure of the white organic light emitting cell 170 is a double-layer structure including a first emissive layer 155 and a second emissive layer 165. The first emissive layer 155 has a structure in which a first sub-emissive layer 153 and a second sub-emissive layer 154 are stacked, and the second emissive layer 165 has a structure in which a third sub-emissive layer 163 and a fourth sub-emissive layer 164 are stacked.

Figure 3:
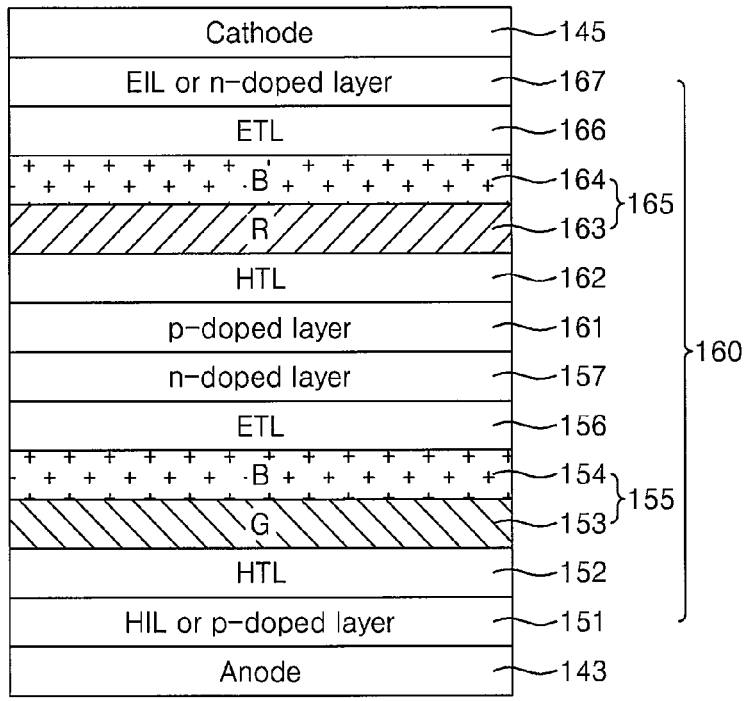
FIG. 3 is a cross-sectional view showing a stacked structure of a white organic light emitting cell in accordance with a first exemplary embodiment of the present invention.

FIG. 3 is a cross-sectional view showing a stacked structure of a white organic light emitting cell in accordance with a first exemplary embodiment of the present invention.

Referring to the FIG. 3, the stacked structure of the white organic light emitting cell 170 in accordance with the first embodiment of the present invention includes an anode 143, a first emissive layer 155, first and second intermediate layers 157 and 161, a second emissive layer 165, and a cathode 145.

The first emissive layer 155 has a structure in which a first sub-emissive layer 153 of green (G) and a second sub-emissive layer 154 of blue (B) are stacked, and the second emissive layer 165 has a structure in which a third sub-emissive layer 163 of red (R) and a fourth sub-emissive layer 164 of blue (B) are stacked.

The first and second intermediate layers 157 and 161 are formed between the first emissive layer 155 and the second emissive layer 165. The first intermediate layer 157 supplies electrons to the first emissive layer 155, and the second intermediate layer 161 supplies holes to the second emissive layer 165.

Such first and second intermediate layers 157 and 161 may be formed of a thin metal layer such as aluminum (Al) or a transparent electrode such as indium tin oxide (ITO). Moreover, the first and second intermediate layers 157 and 161 may be formed of an impurity-doped organic layer. In particular, the first intermediate layer 157 may be doped with n-type impurities to enhance the electron transport, and the second layer 161 may be doped with p-type impurities to enhance the hole transport.

A hole injection layer (HIL) 151 may be further provided between the anode 143 and the first emissive layer 155, and an electron injection layer (EIL) 167 may be further provided between the cathode 145 and the second emissive layer 165. The hole injection layer 151 may be formed of a material having excellent hole injection capability to enhance the hole injection, and the electron injection layer 167 may be formed of a material having excellent electron injection capability to enhance the electron injection. Moreover, the hole injection layer 151 may be doped with p-type impurities to enhance the hole injection, and the electron injection layer 167 may be doped with n-type impurities to enhance the electron injection.

A first hole transport layer (HTL) 152 may be further provided between the hole injection layer 151 and the first emissive layer 155, and a second hole transport layer (HTL) 162 may be further provided between the second intermediate layer 161 and the second emissive layer 165.

Moreover, a first electron transport layer (ETL) 156 may be further provided between the first emissive layer 155 and the first intermediate layer 157, and a second electron transport layer (ETL) 166 may be further provided between the second emissive layer 165 and the electron injection layer 167.

When a voltage is applied between the anode 143 and the cathode 145 of the organic light emitting cell 170 having the above-described stacked structure, electrons are generated in the first intermediate layer 157 and transferred to the first emissive layer 155, and holes are generated in the anode 143 and the hole injection layer 151 and transferred to the first emissive layer 155, and the thus generated electrons and holes are combined to emit light.

Moreover, electrons are generated in the cathode 145 and the electron injection layer 167 and transferred to the second emissive layer 165, and holes are generated in the second intermediate layer 161 and transferred to the second emissive layer 165, and the thus generated electrons and holes are combined to emit light.

The stacked structure of the organic light emitting cell 170 in accordance with the present invention is a double-layer structure in which the blue (B) emissive layer is provided in the first emissive layer 155 and the second emissive layer 165, respectively. That is, it is possible to improve the light emission efficiency of the organic light emitting device by providing the blue (B) emissive layer, which has the lowest light emission efficiency among the red (R), green (G) and blue (B) emissive layers, in the first emissive layer 155 and the second emissive layer 165, respectively. Moreover, with such a stacked structure, the number of processes is reduced to achieve a reduction in manufacturing cost, compared with the case where the R, G and B emissive layers are all stacked in a double-layer.

Figure 4:
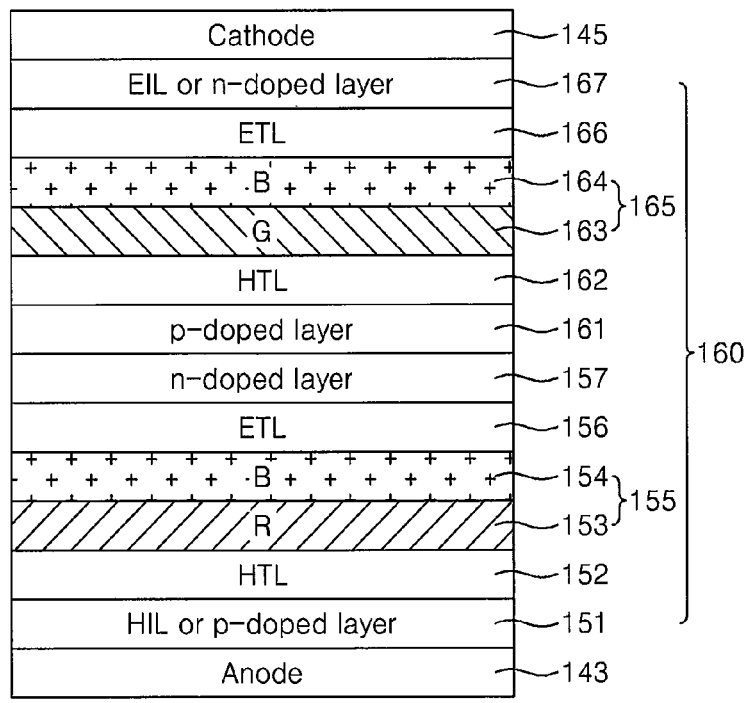
FIG. 4 is a cross-sectional view showing a stacked structure of a white organic light emitting cell in accordance with a second exemplary embodiment of the present invention.

FIG. 4 is a cross-sectional view showing a stacked structure of a white organic light emitting cell in accordance with a second exemplary embodiment of the present invention.

Referring to the FIG. 4, the stacked structure of the white organic light emitting cell 170 in accordance with the second embodiment of the present invention includes an anode 143, a first emissive layer 155, first and second intermediate layers 157 and 161, a second emissive layer 165, and a cathode 145.

The first emissive layer 155 has a structure in which a first sub-emissive layer 153 of red (R) and a second sub-emissive layer 154 of blue (B) are stacked, and the second emissive layer 165 has a structure in which a third sub-emissive layer 163 of green (G) and a fourth sub-emissive layer 164 of blue (B) are stacked.

Since the stacked structure including the first and second intermediate layers 157 and 161, a hole injection layer 151, an electron injection layer 167, first and second hole transport layers 152 and 162, and first and second electron transport layers 156 and 166, and the light emitting mechanism thereof are the same as the first embodiments, their detailed description will be omitted.

Figure 5:
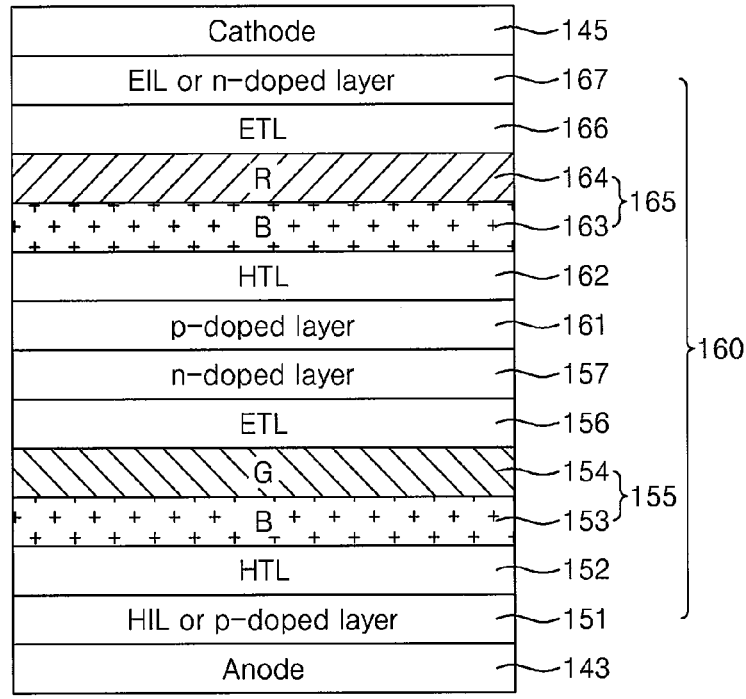
FIG. 5 is a cross-sectional view showing a stacked structure of a white organic light emitting cell in accordance with a third exemplary embodiment of the present invention.

FIG. 5 is a cross-sectional view showing a stacked structure of a white organic light emitting cell in accordance with a third exemplary embodiment of the present invention.

Referring to FIG. 5, the stacked structure of the white organic light emitting cell 170 includes an anode 143, a first emissive layer 155, first and second intermediate layers 157 and 161, a second emissive layer 165, and a cathode 145.

The first emissive layer 155 has a structure in which a first sub-emissive layer 153 of blue (B) and a second sub-emissive layer 154 of green (G) are stacked, and the second emissive layer 165 has a structure in which a third sub-emissive layer 163 of blue (B) and a fourth sub-emissive layer 164 of red (R) are stacked.

Since the stacked structure including the first and second intermediate layers 157 and 161, a hole injection layer 151, an electron injection layer 167, first and second hole transport layers 152 and 162, and first and second electron transport layers 156 and 166, and the light emitting mechanism thereof are the same as the first and second exemplary embodiments, their detailed description will be omitted.

Figure 6:
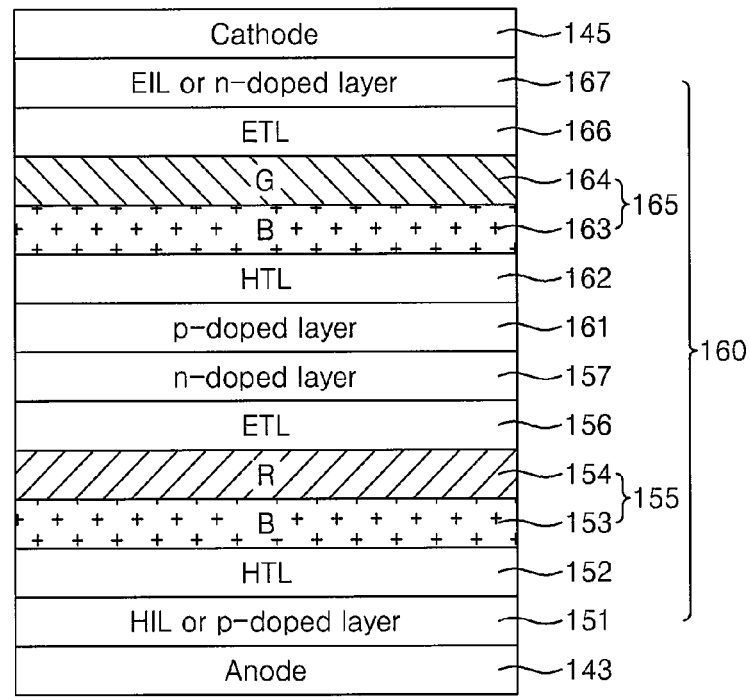
FIG. 6 is a cross-sectional view showing a stacked structure of a white organic light emitting cell in accordance with a fourth exemplary embodiment of the present invention.

FIG. 6 is a cross-sectional view showing a stacked structure of a white organic light emitting cell in accordance with a fourth exemplary embodiment of the present invention.

Referring to FIG. 6, the stacked structure of the white organic light emitting cell 170 includes an anode 143, a first emissive layer 155, first and second intermediate layers 157 and 161, a second emissive layer 165, and a cathode 145.

The first emissive layer 155 has a structure in which a first sub-emissive layer 153 of blue (B) and a second sub-emissive layer 154 of red (R) are stacked, and the second emissive layer 165 has a structure in which a third sub-emissive layer 163 of blue (B) and a fourth sub-emissive layer 164 of green (G) are stacked.

Since the stacked structure including the first and second intermediate layers 157 and 161, a hole injection layer 151, an electron injection layer 167, first and second hole transport layers 152 and 162, and first and second electron transport layers 156 and 166, and the light emitting mechanism thereof are the same as the first to third embodiments, their detailed description will be omitted.

Figure 7:
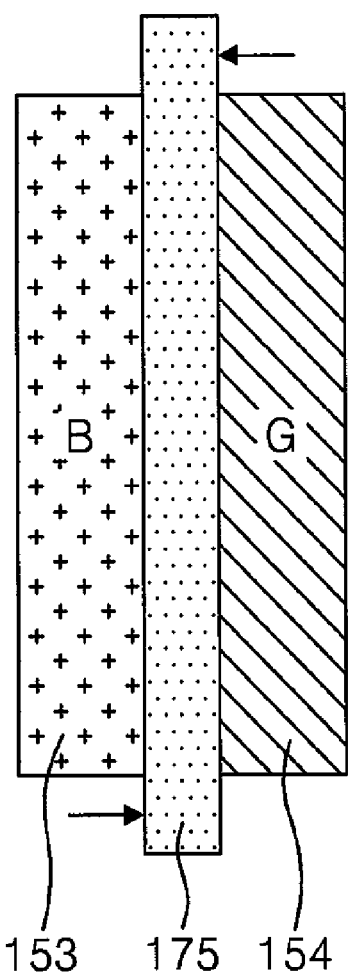
FIG. 7 is a cross-sectional view showing a blocking layer for color tuning stacked between sub-emissive layers in accordance with an exemplary embodiment of the present invention.

FIG. 7 is a cross-sectional view showing a blocking layer for color tuning stacked between sub-emissive layers in accordance with an exemplary embodiment of the present invention. According to the exemplary embodiment of the present invention, a blocking layer 175 for color tuning is provided between the first sub-emissive layer 153 and the second sub-emissive layer 154. Moreover, the blocking layer 175 may be provided between the third sub-emissive layer and the fourth sub-emissive layer. Referring to FIG. 7, the blocking layer 175 for color tuning is formed between the first sub-emissive layer 153 of blue (B) and second sub-emissive layer 154 of green (G). In order to achieve a color image with high resolution in a display device, the ratio of blue (B), green (G) and red (R) should be accurately controlled. However, if the mobility of electrons and holes in the respective emissive layers is too high, it is difficult to control the ratio of blue (B), green (G) and red (R) colors, thus not achieving an accurate color. Accordingly, the above-described embodiment includes the blocking layer 175 between the first sub-emissive layer 153 and the second sub-emissive layer 154 With the foregoing structure it is possible to facilitate color tuning by controlling the mobility of electron and holes. Although the description has been given to the case where the blocking layer 175 is provided between the first sub-emissive layer 153 of blue (B) and the second sub-emissive layer 154 of green (G), the blocking layer 175 may further provided between the other sub-emissive layers of different colors or between the third sub-emissive layer and the fourth sub-emissive layer to improve the light emission efficiency of the organic light emitting device.

As described above, the organic light emitting device in accordance with the present invention includes first and second emissive layers each having a blue (B) emissive layer to improve the light emission efficiency. With the double-layer structure in which the blue (B) emissive layer is provided in the first and second emissive layers, respectively, the present invention solves the problem caused by the lower light emission efficiency of the blue (B) emissive layer compared to that of the green (G) and red (R) emissive layers.

Moreover, with the blocking layer further provided between the respective emissive layers, it is possible to provide an efficient color tuning by easily controlling the mobility of electrons and holes.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A white organic light emitting device comprising:
   an anode disposed on a substrate;
   a first emissive layer disposed on the anode and having a first sub-emissive layer and a second sub-emissive layer stacked thereon;
   a second emissive layer disposed on the first emissive layer and having a third sub-emissive layer and a fourth sub-emissive layer that are stacked;
   a first intermediate layer supplying electrons to the first emissive layer and a second intermediate layer supplying holes to the second emissive layer, wherein the first and second intermediate layers are formed between the first emissive layer and the second emissive layer; and
   a cathode formed on the second emissive layer,
   wherein two layers of the first sub-emissive layer, the second sub-emissive layer, the third sub-emissive layer and the fourth sub-emissive layer emit a light having a blue color, and a color of a first light emitted from the first emissive layer is different from a color of a second light emitted from the second emissive layer.

2. The white organic light emitting device of claim 1, wherein the first sub-emissive layer comprises a green (G) emissive layer, the second sub-emissive layer comprises a blue (B) emissive layer, the third sub-emissive layer comprises a red (R) emissive layer, and the fourth sub-emissive layer comprises a blue (B) emissive layer.

3. The white organic light emitting device of claim 1, wherein the first sub-emissive layer comprises a red (R) emissive layer, the second sub-emissive layer comprises a blue (B) emissive layer, the third sub-emissive layer comprises a green (G) emissive layer, and the fourth sub-emissive layer comprises a blue (B) emissive layer.

4. The white organic light emitting device of claim 1, wherein the first sub-emissive layer comprises a blue (B) emissive layer, the second sub-emissive layer comprises a green (G) emissive layer, the third sub-emissive layer comprises a blue (B) emissive layer, and the fourth sub-emissive layer comprises a red (R) emissive layer.

5. The white organic light emitting device of claim 1, wherein the first sub-emissive layer comprises a blue (B) emissive layer, the second sub-emissive layer comprises a red (R) emissive layer, the third sub-emissive layer comprises a blue (B) emissive layer, and the fourth sub-emissive layer comprises a green (G) emissive layer.

6. The white organic light emitting device of claim 1, wherein a hole injection layer is further included between the anode and the first emissive layer.

7. The white organic light emitting device of claim 6, wherein the hole injection layer is doped with p-type impurities to enhance the hole injection.

8. The white organic light emitting device of claim 7, wherein a first hole transport layer is further included between the anode and the hole injection layer, and a second hole transport layer is further included between the first and second intermediate layers and the second emissive layer.

9. The white organic light emitting device of claim 8, wherein an electron injection layer is further included between the second emissive layer and the cathode.

10. The white organic light emitting device of claim 9, wherein the electron injection layer is doped with n-type impurities to enhance the electron injection.

11. The white organic light emitting device of claim 10, wherein a first electron transport layer is further included between the first emissive layer and the first and second intermediate layers, and a second electron transport layer is further included between the second emissive layer and the electron injection layer.

12. The white organic light emitting device of claim 1, wherein the first intermediate layer comprises an organic layer doped with n-type impurities and the second intermediate layer comprises an organic layer doped with p-type impurities.

13. The white organic light emitting device of claim 12, wherein the first and second intermediate layers are formed of a transparent metal material.

14. The white organic light emitting device of claim 13, wherein a blocking layer is further included between the first sub-emissive layer and the second sub-emissive layer and between the third sub-emissive layer and the fourth sub-emissive layer, respectively.

15. The white organic light emitting device of claim 1, wherein the first light is mixed with the second light to form a white light.

* * * * *